United States Patent [19]

Shimizu et al.

[11] Patent Number: 4,994,874
[45] Date of Patent: Feb. 19, 1991

[54] INPUT PROTECTION CIRCUIT FOR SEMICONDUCTOR INTEGRATED CIRCUIT DEVICE

[75] Inventors: Mitsuru Shimizu, Sakura; Yoshio Okada, Tokyo; Syuso Fujii, Kawasaki; Shozo Saito, Yokohama, all of Japan

[73] Assignee: Kabushiki Kaisha Toshiba, Kawasaki, Japan

[21] Appl. No.: 425,950

[22] Filed: Oct. 24, 1989

[30] Foreign Application Priority Data

Oct. 28, 1988 [JP] Japan ............... 63-272586

[51] Int. Cl.[5] .................. H01L 29/06; H01L 29/72; H01L 27/02
[52] U.S. Cl. .................. 357/23.13; 357/13; 357/20; 357/35; 357/46; 357/49
[58] Field of Search ............ 357/23.13, 35, 13, 20, 357/23.11, 46, 49

[56] References Cited

U.S. PATENT DOCUMENTS

| | | | |
|---|---|---|---|
| 4,733,285 | 3/1988 | Ishioka et al. | 357/23.13 |
| 4,789,917 | 12/1988 | Miller | 357/23.13 |
| 4,819,047 | 4/1989 | Gilfeather et al. | 357/44 |
| 4,849,654 | 7/1989 | Okado . | |

FOREIGN PATENT DOCUMENTS

| | | | |
|---|---|---|---|
| 0225586 | 6/1987 | European Pat. Off. | 357/23.13 |
| 54-8474 | 1/1979 | Japan | 357/23.13 |
| 58-182861 | 10/1983 | Japan | 357/23.13 |
| 61-73375 | 4/1986 | Japan | 357/23.13 |
| 62-115764 | 5/1987 | Japan | 357/23.13 |

*Primary Examiner*—Andrew J. James
*Assistant Examiner*—Ngan Van Ngo
*Attorney, Agent, or Firm*—Finnegan, Henderson, Farabow, Garrett, and Dunner

[57] ABSTRACT

First to third N+-type impurity regions are formed separately from one another by a preset distance in the surface area of a P-type semiconductor substrate or a P-well region formed in an N-type semiconductor substrate. The first impurity region is connected to a power source and the second impurity region is connected to a ground terminal. The third impurity region formed between the first and second impurity regions is connected to one end of an input protection resistor which is connected at the other end to a signal input pad. The first impurity region, the third impurity region and that portion of the P-type semiconductor substrate or P-well region which lies between the first and third impurity regions constitute a first bipolar transistor for input protection and the second impurity region, the third impurity region and that portion of the P-type semiconductor substrate or P-well region which lies between the second and third impurity regions constitute a second bipolar transistor for input protection. The resistor and the first and second bipolar transistors constitute an input protection circuit.

10 Claims, 6 Drawing Sheets

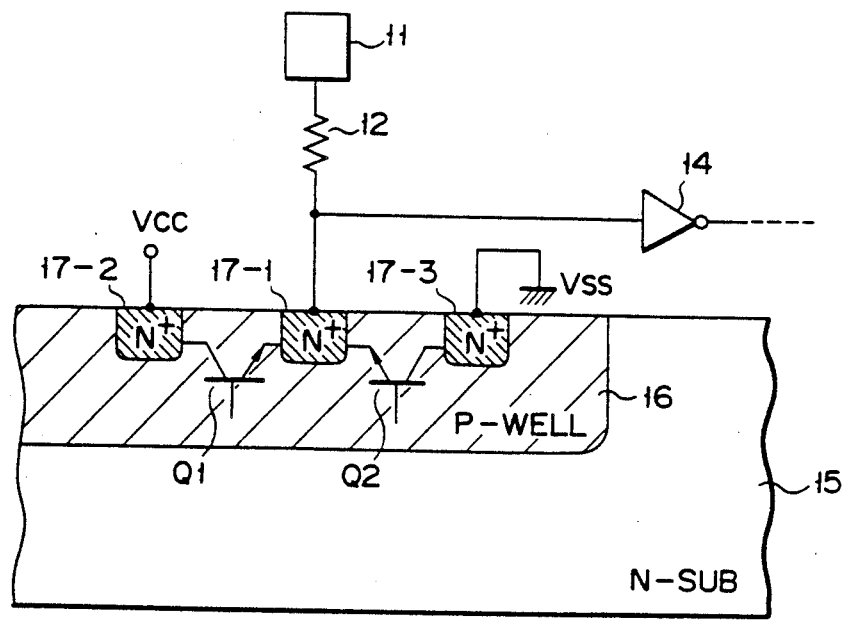
F I G. 3
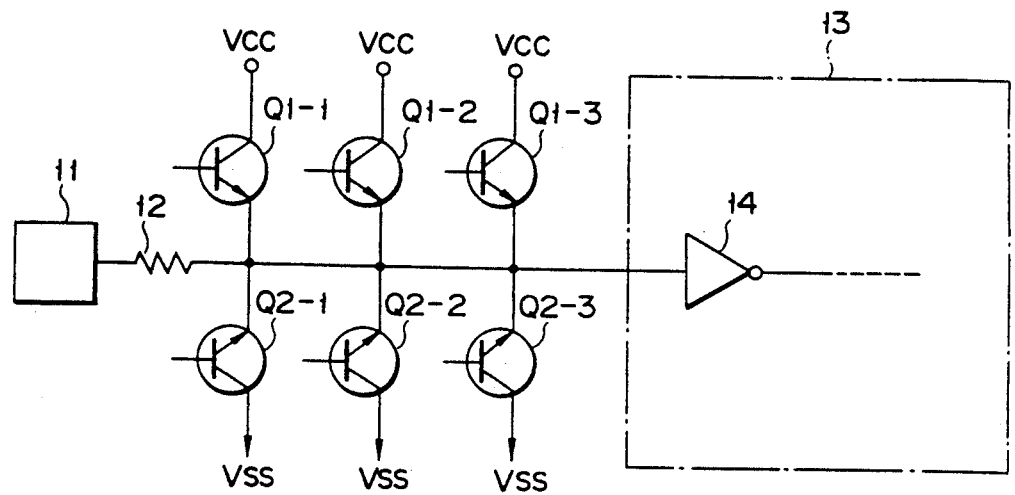
F I G. 4

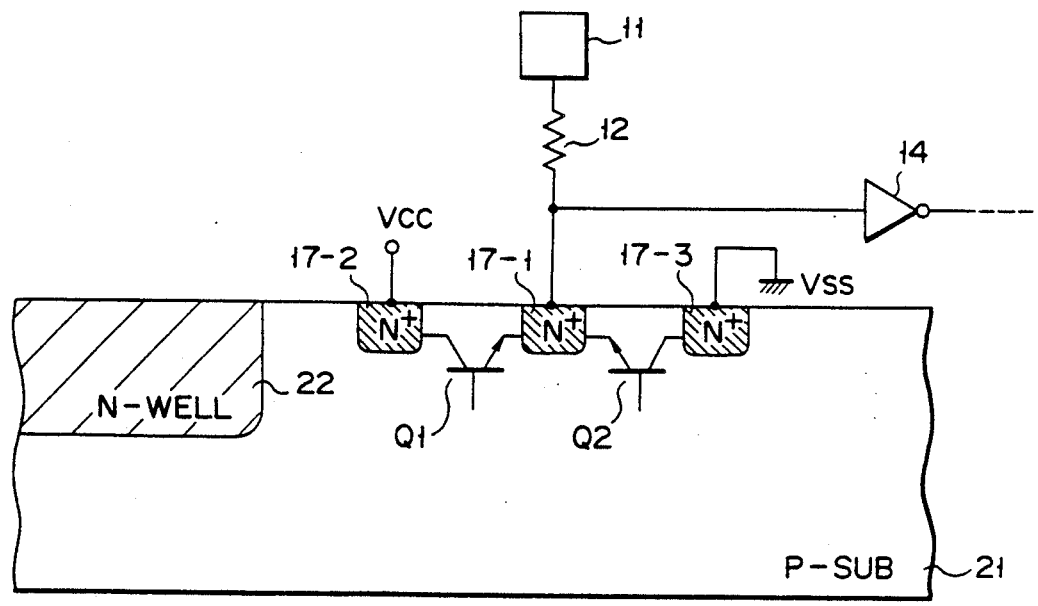
F I G. 7
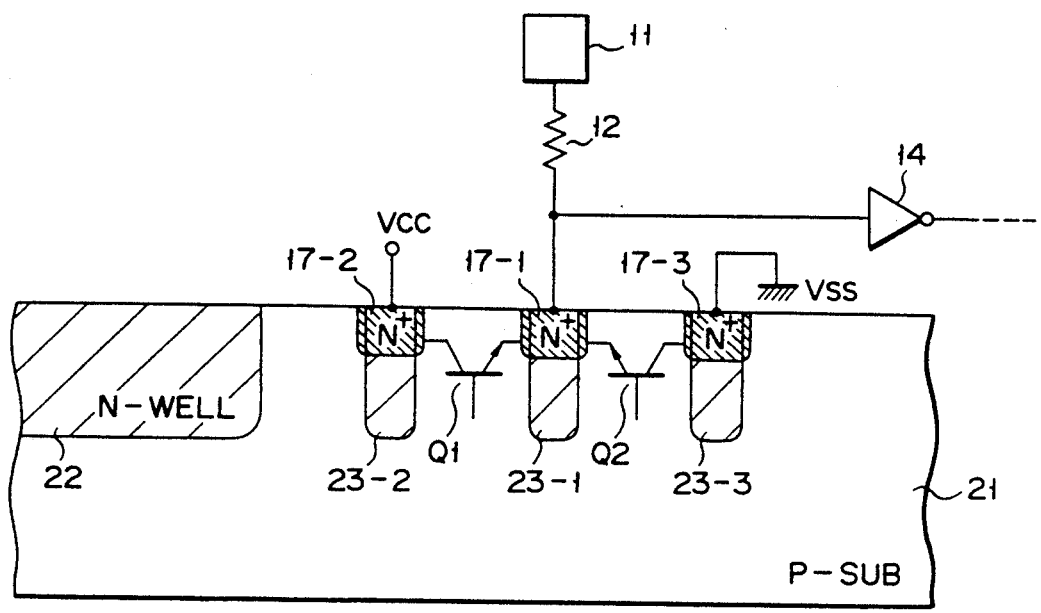
F I G. 8

INPUT PROTECTION CIRCUIT FOR SEMICONDUCTOR INTEGRATED CIRCUIT DEVICE

BACKGROUND OF THE INVENTION

1. Field of the Invention

This invention relates to an input protection circuit for protecting a semiconductor integrated circuit device from the electrostatic breakdown.

2. Description of the Related Art

It is known that the semiconductor integrated circuit device may be electrostatically broken down by the static electricity charged on the human body or the like. Degradation of the characteristic of the semiconductor device, breakdown of the PN junction and dielectric breakdown of the oxide film may be caused by a so-called electrostatic discharge (ESD). Particularly, in recent years, the electrostatic withstanding voltage of the integrated circuit (IC) tends to be lowered as the semiconductor elements are more miniaturized.

A plurality of pads are disposed on the peripheral surface of the ordinary IC chip. The pads include a power source pad to which a power source voltage Vcc is applied, a ground pad which is set at a ground potential Vss and a signal input or output pad. The power source pad is connected to a Vcc wiring, the ground pad is connected to a Vss wiring and the Vcc and Vss wirings are formed to extend to every portion of the chip surface.

In general, an input protection circuit is provided between the signal input pad and the input buffer of the IC to protect the internal elements from breakdown due to the ESD. The input protection circuit used in the conventional semiconductor integrated circuit device is basically constituted by an input protection resistor and an input protection transistor. For example, the signal input pad is connected to one end of the input protection resistor formed of a diffusion layer, polysilicon layer or the like. The other end of the resistor is connected to the emitter of the input protection NPN bipolar transistor and to the input terminal of the input buffer. Further, the collector of the transistor is connected to the ground terminal, and then the resistor and transistor functions as an input protection circuit.

When an N-type semiconductor substrate is used, the input protection NPN bipolar transistor is constructed as follows. That is, a P-well region is formed in the surface area of the semiconductor substrate and first and second N+-type impurity regions are separately formed in the P-well region. The first N+-type impurity region is connected to the signal input pad via the input protection resistor. The second N+-type region is connected to the ground terminal Vss. The transistor is formed to have the first N+-type region as an emitter, the second N+-type region as a collector and that portion of the P-well region which lies between the first and second N+-type regions as a base.

In order to subject the above semiconductor integrated circuit device to the ESD test under the MIL standard, two methods using a Vss reference and a Vcc reference may be available. The ESD test using the Vss reference is effected under a condition that the ground pad of the IC is set at 0 V. In this case, the other pads are set in the electrically floating state. On the other hand, the ESD test using the Vcc reference is effected under a condition that the power source pad of the IC is set at 0 V. In this case, like the ESD test using the Vss reference, the other pads are set in the electrically floating state.

In a case where the conventional semiconductor device having the above input protection circuit is subjected to the ESD test using the Vss reference, an excessively high voltage applied to the signal pad is absorbed into the ground terminal Vss via the protection transistor so that the internal element can be protected from breakdown due to the excessively high voltage. However, in a case where the conventional semiconductor device is subjected to the ESD test using the Vcc reference, there is no path which permits an excessively high voltage applied to the signal pad to be discharged. Therefore, the withstanding voltage with respect to the ESD becomes smaller than in the case of using the Vss reference. When the semiconductor integrated circuit device is actually operated, the ESD may occur in any operating condition of the semiconductor integrated circuit device. Therefore, it is strongly required to enhance the withstanding voltage with respect to the ESD in the case of using the Vcc reference.

SUMMARY OF THE INVENTION

Accordingly, an object of this invention is to provide an input protection circuit in which the withstanding voltages with respect to the ESD, when using the Vcc reference and Vss reference, are both sufficiently high and to provide an input protection circuit which is highly reliable.

The above objects can be attained by an input protection circuit formed in a chip in which a semiconductor integrated circuit device is formed, comprising a semiconductor substrate of a first conductivity type; a first semiconductor region of a second conductivity type formed in the surface area of the semiconductor substrate and connected to a first wiring to which a first potential is applied; a second semiconductor region of the second conductivity type formed separately from the first semiconductor region in the surface area of the semiconductor substrate and connected to a second wiring to which a second potential is applied; and a third semiconductor region of the second conductivity type connected to a signal input pad and formed in that portion of the surface area of the semiconductor substrate which lies between the first and second semiconductor regions and is separated from the first and second semiconductor regions.

In the above input protection circuit, the first semiconductor region, third semiconductor region and that portion of the semiconductor substrate which lies between the first and third semiconductor regions constitute a first bipolar transistor for input protection and the second semiconductor region, third semiconductor region and that portion of the semiconductor substrate which lies between the second and third semiconductor regions constitute a second bipolar transistor for input protection. The first bipolar transistor is operated during the ESD test using the Vcc reference and causes an excessively high voltage applied to the signal input pad to be transmitted to the first wiring. The second bipolar transistor is operated during the ESD test using the Vss reference and causes an excessively high voltage applied to the signal input pad to be transmitted to the second wiring. As a result, the electrostatic breakdown voltages with respect to the Vcc reference and Vss reference become high.

In this way, an input protection circuit in which the withstanding voltages with respect to the ESD when using the Vcc reference and Vss reference are both sufficiently high and the input protection circuit is highly reliable.

BRIEF DESCRIPTION OF THE DRAWINGS

FIG. 3 is a cross sectional view of the pattern taken along the line X—X' of FIG. 2;

FIG. 4 is a circuit diagram of an input protection circuit according to a second embodiment of this invention;

FIGS. 7 to 9 are cross sectional views showing input protection circuits of third to fifth embodiments, respectively.

DETAILED DESCRIPTION OF THE PREFERRED EMBODIMENTS

Figure 1:
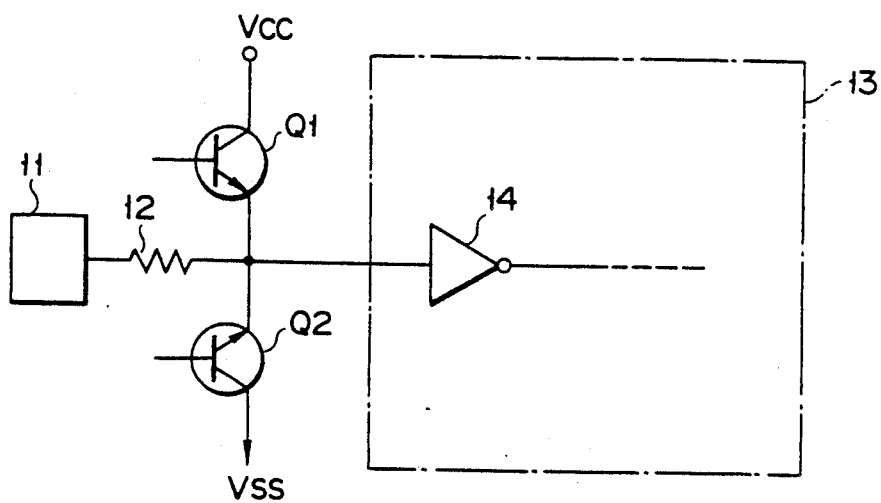
FIG. 1 is a circuit diagram showing the construction of an input protection circuit according to a first embodiment of this invention.

FIG. 1 is a circuit diagram showing an input protection circuit according to a first embodiment of this invention. A signal input pad 11 is connected to one end of an input protection resistor 12 formed of a polysilicon layer or diffusion layer. The other end of the resistor 12 is connected to the emitters of input protection NPN bipolar transistors Q1 and Q2 and to the input terminal of an input buffer (for example, CMOS inverter) 14 provided in the input stage of an internal circuit 13. The collector of the transistor Q1 is connected to a power source line to which a power source voltage Vcc is applied. The collector of the transistor Q2 is connected to a ground line to which a ground potential Vss is applied.

Figure 2:
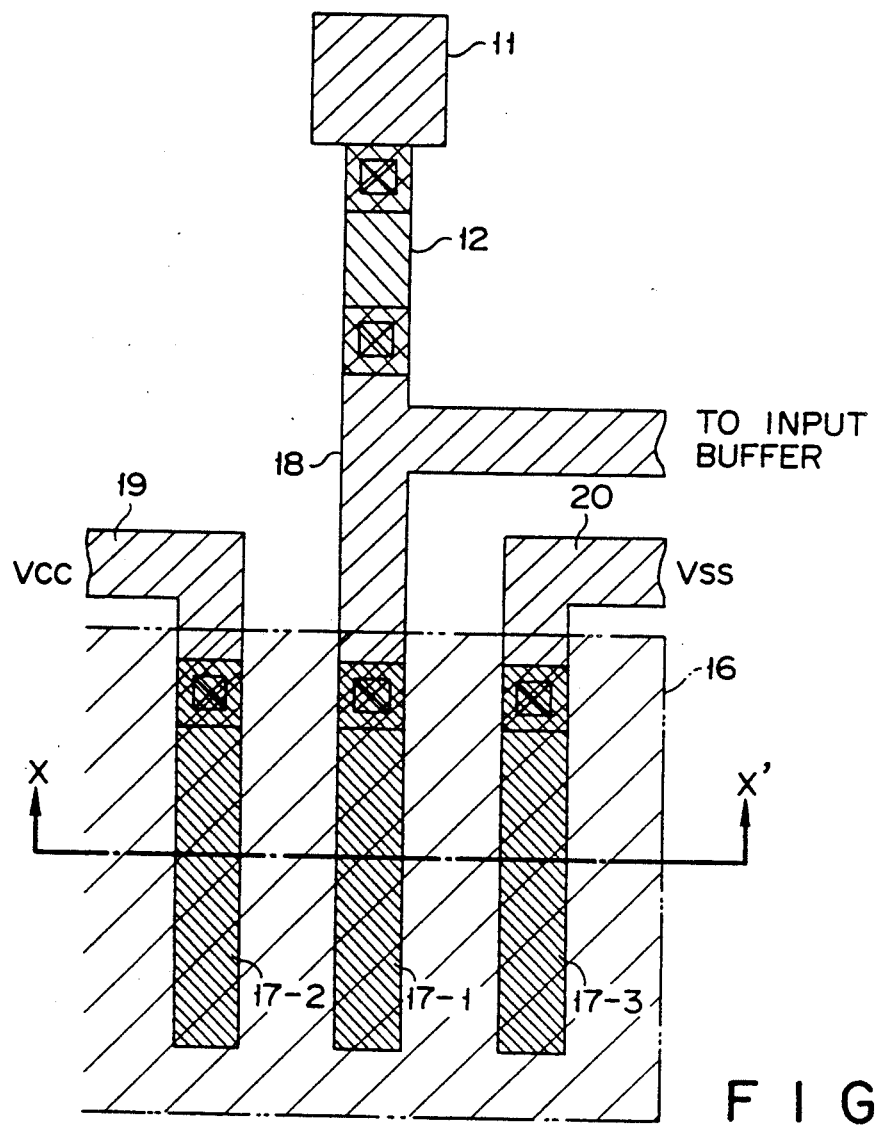
FIG. 2 is a pattern plan view of the input protection circuit shown in FIG. 1.

FIG. 2 is a pattern plan view showing an example of the construction of an integrated circuit corresponding to the circuit of FIG. 1 and FIG. 3 is a cross sectional view of the pattern taken along the line X—X' of FIG. 2. A P-well region 16 is formed in the surface area of an N-type semiconductor substrate 15 and N+-type impurity regions 17-1 to 17-3 are formed at a regular interval in a stripe form in the surface area of the P-well region 16. One end of the N+-type impurity region 17-1 is connected to a wiring layer 18 formed of aluminum or the like. The wiring layer 18 is connected to the input terminal of an input buffer 14 and to one end of the resistor 12 which is connected at the other end to the signal input pad 11. One end of the N+-type impurity region 17-2 is connected to a power source line 19 formed of aluminum or the like to which a power source voltage Vcc is applied. Further, one end of the N+-type impurity region 17-3 is connected to a power source line 20 formed of aluminum or the like to which a ground potential Vss is applied.

The transistor Q1 is formed to have the N+-type impurity region 17-1 as an emitter (or collector), the N+-type impurity region 17-2 as a collector (or emitter) and that portion of the P-well region 16 which lies between the impurity regions 17-1 and 17-2 as a base. The transistor Q2 is formed to have the N+-type impurity region 17-1 as an emitter (or collector), the N+-type impurity region 17-3 as a collector (or emitter) and that portion of the P-well region 16 which lies between the impurity regions 17-1 and 17-3 as a base.

The N+-type impurity regions 17-2 and 17-3 are separated from the N+-type impurity region 1 connected to the pad 11 by a distance of approx. 2 μm so that the PN junction current will easily flow when an ordinary input voltage is applied. More specifically, only when an excessively high voltage applied in the case of ESD test is input to the pad 11, the bipolar transistors Q1 and Q2 are turned on, causing the excessively high voltage to be absorbed into one of the power source voltage terminal Vcc and ground potential terminal Vss. That is, in the case of the ESD test using the Vss reference, the transistor Q2 is turned on, causing the excessively high voltage applied to the pad 11 to be transmitted to the ground line 20 applied with 0 V) connected to the ground terminal Vss. On the other hand, in the case of the ESD test using the Vcc reference, the transistor Q1 is turned on, causing the excessively high voltage applied to the pad 11 to be transmitted to the power source line 19 (applied with 0 V).

In the first embodiment, an input protection NPN bipolar transistor is connected between the other end of the input protection resistor 12 and the power source terminal Vcc and another input protection NPN bipolar transistor is connected between the other end of the resistor 12 and the power source terminal Vss. However, if it is required to further enhance the protection effect, it is possible to connect a plurality of input protection NPN bipolar transistors in parallel between the other end of the resistor 12 and the power source terminal Vcc and connect a plurality of input protection NPN bipolar transistors in parallel between the other end of the resistor 12 and the ground terminal Vss.

FIG. 4 is a circuit diagram showing an input protection circuit according to a second embodiment of this invention. In this embodiment, three input protection NPN bipolar transistors Q1-1 to Q1-3 are connected in parallel between one end of a resistor 12 and a power source terminal Vcc and three input protection NPN bipolar transistors Q2-1 to Q2-3 are connected in parallel between one end of the resistor 12 and a ground terminal Vss. That is, the signal input pad 11 is connected to one end of the input protection resistor 12 formed of a polysilicon layer or a diffusion layer. The other end of the resistor 12 is connected to the emitters of the input protection NPN bipolar transistors Q1-1 to Q1-3, Q2-1 to Q2-3 and to the input terminal of the input buffer (for example, CMOS inverter) 14 provided in the input stage of the internal circuit 13. The collectors of the transistors Q1-1 to Q1-3 are connected to a power source line to which a power source voltage Vcc is applied. The collectors of the transistors Q2-1 to Q2-3 are connected to a ground line to which a ground voltage Vss is applied.

Figure 5:
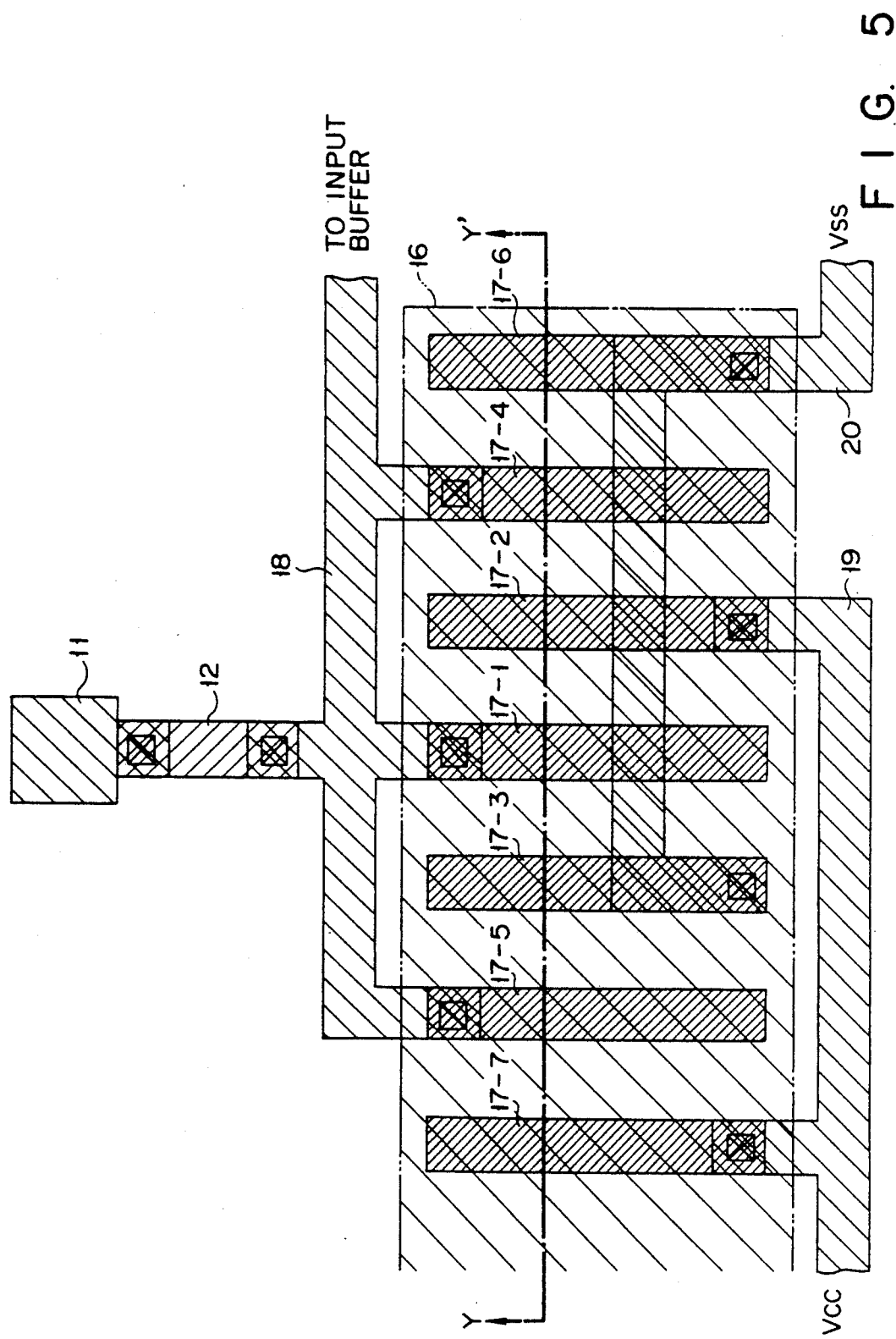
FIG. 5 is a pattern plan view of the input protection circuit shown in FIG. 4.
Figure 6:
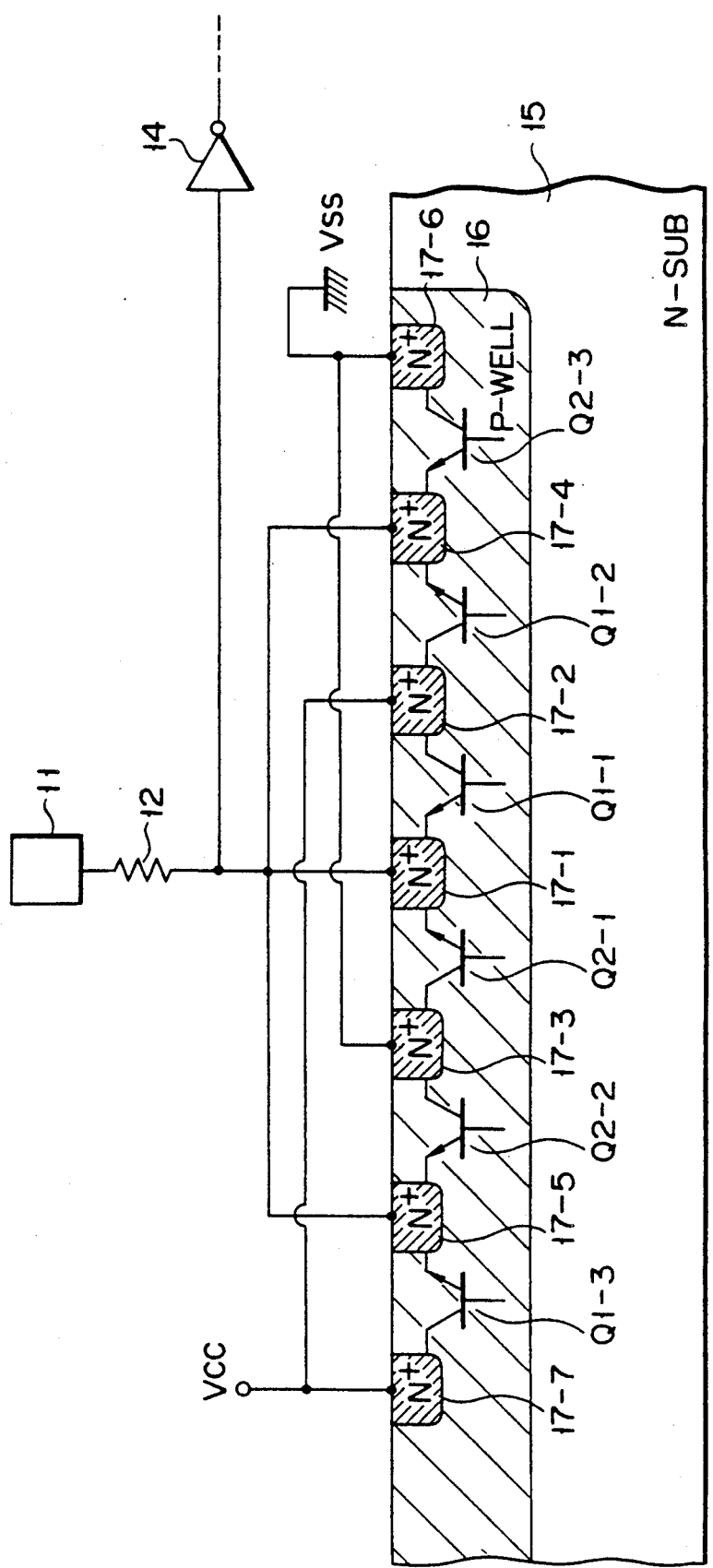
FIG. 6 is a cross sectional view of the pattern taken along the line Y—Y' of FIG. 5.

FIG. 5 is a pattern plan view showing the construction of an integrated circuit corresponding to the circuit shown in FIG. 4, and FIG. 6 is a cross sectional view of the pattern taken along the line Y—Y' of FIG. 5. The construction of FIGS. 5 and 6 is similar to that of FIGS. 2 and 3 except that seven diffusion layers 17-1 to 17-7 are formed in a well region 16. The diffusion layers 17-1, 17-4 and 17-5 are connected at one end to a wiring 18, the diffusion layers 17-2 and 17-7 are connected at one end to a power source line 19 and the diffusion layers 17-3 and 17-6 are connected at one end to a ground line 20. A transistor Q1-1 is constituted by the N+-type impurity regions 17-1 and 17-2 and that portion of the P-well region 16 which lies between the impurity regions 17-1 and 17-2. A transistor Q2-1 is constituted by the N+-type impurity regions 17-1 and 17-3 and that portion of the P-well region 16 which lies between the impurity regions 17-1 and 17-3. Likewise, each of transistors Q1-2, Q1-3, Q2-2 and Q2-3 is constituted by adjacent two of the N+-type impurity regions 17-2 to 17-7 and that portion of the P-well region 16 which lies between the adjacent two of the impurity regions 17-2 and 17-7.

With the above construction, the protection effect can be more enhanced in comparison with the embodiment of FIGS. 1 to 3. In addition, the N+-type impurity regions 17-1 to 17-5 are commonly used as the emitter or collector of the two transistors so that the protection effect can be enhanced by increasing the pattern area only by a small amount.

FIG. 7 is a cross sectional view of an input protection circuit according to a third embodiment of this invention. In this embodiment, a P-type semiconductor substrate 21 is used. N+-type impurity regions 17-1 to 17-3 are formed in the main surface area of the substrate 21. In this case, an N-well region 22 is used to form an internal circuit (including the input buffer 14) in the circuit of FIGS. 1 and 4.

With the above construction, only the conductivity type of the substrate is changed and substantially the same operation and effect as those of the first and second embodiments can be obtained.

FIG. 8 is a cross sectional view of an input protection circuit according to a fourth embodiment of this invention which is obtained by improving the third embodiment. That is, in the construction of FIG. 7, the diffusion depth of the N+-type impurity regions 17-1 to 17-3 is relatively small and therefore the PN junction may be easily broken when an excessively high voltage is applied to a signal input pad 11. Therefore, in the fourth embodiment, N-type impurity regions 23-1 to 23-3 are formed in the same step in which the N-well region 22 is formed, and then the N+-type impurity regions 17-1 to 17-3 are formed to overlap the N-type impurity regions 23-1 to 23-3.

With the above construction, diffusion depth of the N+-type impurity regions 17-1 to 17-3 is made substantially larger, and therefore the breakdown voltage occurring when an excessively high voltage is applied to the signal input pad 11 can be enhanced.

Figure 9:
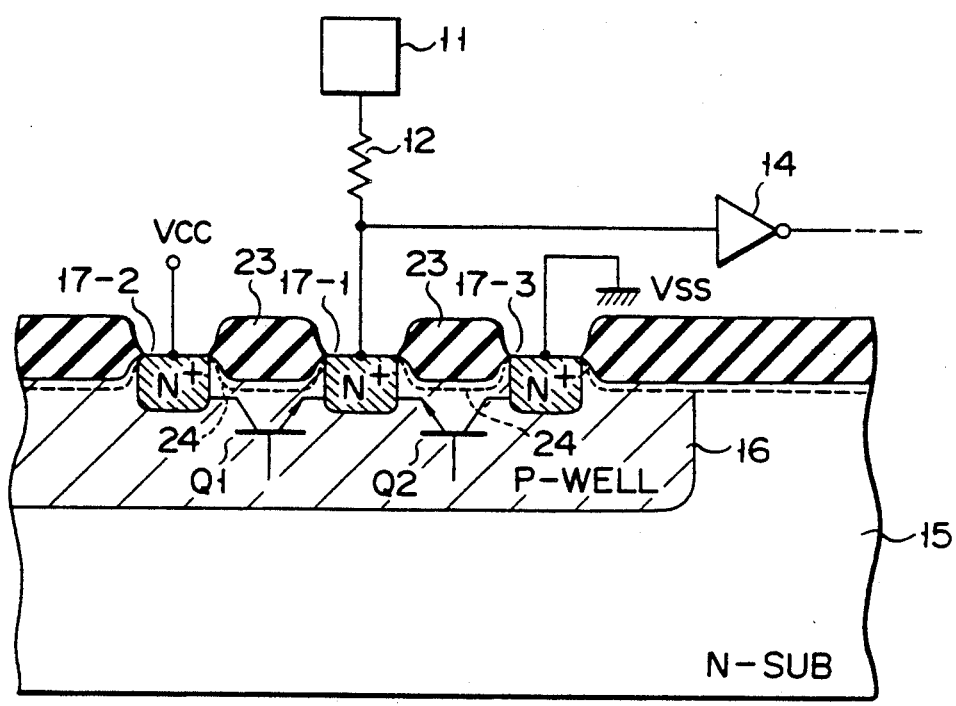

FIG. 9 is a cross sectional view of an input protection circuit according to a fifth embodiment of this invention. In this embodiment, a field oxide film 23 is formed on those portions of the substrate 11 (P-well region 16) which lie between the N+-type impurity regions 17-1, 17-2 and 17-3, and a field inversion prevention layer 24 is formed under the field oxide film 23. The field inversion prevention layer 24 is formed to have an impurity concentration higher than the P-well region 16. Formation of the field inversion prevention layer 24 of high impurity concentration causes the breakdown voltage between the N+-type impurity region 17-1 and the P-well region 16 to be lowered.

Therefore, the input protection transistors Q1 and Q2 may be operated on a relatively low operation voltage, thus enhancing the protection effect.

In the third to fifth embodiments, two input protection transistors are used. However, like the second embodiment, a larger number of input protection NPN bipolar transistors can be connected in parallel between the other end of the resistor 12 and the power source Vcc and between the other end of the resistor 12 and the ground terminal Vss. In this case, the number of transistors used may be selectively set according to the required protection characteristic.

As described above, according to this invention, an input protection circuit can be obtained in which the withstanding voltages with respect to the ESD when using the Vcc reference and Vss reference are both sufficiently high and is highly reliable.

What is claimed is:

1. An input protection circuit formed in a chip in which a semiconductor integrated circuit device is formed, comprising:

a semiconductor body of a first conductivity type;

a first semiconductor region of a second conductivity type formed in a surface area of said semiconductor body and connected to a first wiring to which a first potential is applied, said first semiconductor region serving as a collector region of a first input protection bipolar transistor;

a second semiconductor region of the second conductivity type formed in the surface area of the semiconductor body, separately from said first semiconductor region, and connected to a second wiring to which a second potential is applied, said second potential being different from said first potential, the second semiconductor region serving as a collector region of a second input protection bipolar transistor; and a third semiconductor region of the second conductivity type connected to a signal input pad and formed in the surface area of said semiconductor body, separately from said first and second semiconductor body regions, so as to be located between said first and second semiconductor regions, said third semiconductor region serving as an emitter region common to said first and second bipolar transistors, a portion of said semiconductor body which lies between said first and third semiconductor regions serving as a base region of said first bipolar transistor, a portion of said semiconductor body which lies between said second and third semiconductor regions serving as a base region of said second bipolar transistor, base potentials applied to said first and second bipolar transistors being equal to a potential applied to said semiconductor body.

2. An input protection circuit according to claim 1, wherein said semiconductor body is a P-well region formed in the surface area of an N-type semiconductor substrate and said first to third semiconductor regions are N-type impurity regions of high impurity concentration.

3. An input protection circuit according to claim 1, wherein said semiconductor body is a P-type semiconductor substrate and said first to third semiconductor regions are N-type impurity regions of high impurity concentration.

4. An input protection circuit according to claim 1, wherein said first potential is a power source potential and said second potential is a ground potential.

5. An input protection circuit according to claim 1, wherein said first potential is a ground potential and said second potential is a power source potential.

6. An input protection circuit according to claim 1, wherein a distance between said first and third semiconductor regions and that between said second and third semiconductor regions are set to be not less than 2 μm.

7. An input protection circuit according to claim 1, further comprising first to third impurity regions of the second conductivity type which are formed to overlap the first to third semiconductor regions and whose diffusion depths are larger than said first to third semiconductor regions.

8. An input protection circuit according to claim 7, further comprising an N-well region formed in the surface area of said semiconductor body, and wherein said first to third impurity regions are formed in the same step in which said N-well region is formed.

9. An input protection circuit according to claim 1, further comprising:
a field film formed on a portion of said semiconductor body which lies between said first and third semiconductor regions and on a portion of said semiconductor body which lies between said second and third semiconductor regions; and
a fourth impurity region of the first conductivity type having an impurity concentration higher than said semiconductor body and formed in a portion of said semiconductor body which lies under said field oxide film.

10. An input protection circuit according to claim 9, wherein said fourth impurity region is a field inversion prevention layer.

* * * * *